(12) United States Patent
Van Der Pasch

(10) Patent No.: US 7,317,539 B2
(45) Date of Patent: Jan. 8, 2008

(54) POLARIZING BEAM SPLITTER DEVICE, INTERFEROMETER MODULE, LITHOGRAPHIC APPARATUS, AND DEVICE MANUFACTURING METHOD

(75) Inventor: Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 409 days.

(21) Appl. No.: 10/923,083

(22) Filed: Aug. 23, 2004

(65) Prior Publication Data
US 2006/0039006 A1    Feb. 23, 2006

(51) Int. Cl.
G01B 9/02    (2006.01)
(52) U.S. Cl. .................................. 356/493; 359/497
(58) Field of Classification Search ........ 356/491–493, 356/487; 359/494, 495, 496, 497, 500
See application file for complete search history.

(56) References Cited

U.S. PATENT DOCUMENTS

| | | | |
|---|---|---|---|
| 4,509,858 A * | 4/1985 | Smythe et al. | 356/498 |
| 5,056,921 A * | 10/1991 | Chaney | 356/493 |
| 6,163,379 A * | 12/2000 | de Groot | 356/493 |
| 6,208,424 B1 * | 3/2001 | de Groot | 356/500 |
| 6,876,451 B1 * | 4/2005 | Carlson | 356/498 |
| 2005/0094155 A1 * | 5/2005 | Hill et al. | 356/500 |
| 2005/0195404 A1 * | 9/2005 | Carlson | 356/493 |
| 2006/0087658 A1 * | 4/2006 | Sesko et al. | 356/493 |
| 2006/0132794 A1 * | 6/2006 | Badami et al. | 356/492 |

* cited by examiner

Primary Examiner—Hwa (Andrew) Lee
(74) Attorney, Agent, or Firm—Pillsbury Winthrop Shaw Pittman LLP

(57) ABSTRACT

The invention relates to a polarizing beam splitter device, an interferometer module system, a lithographic apparatus, and a device manufacturing method. The polarizing beam splitter device includes an optical element and a polarizing beam splitter layer. The optical element includes a retroreflector surface having three mutually perpendicular faces of high optical quality, a radiation beam passage surface and a handling surface. By designing the optical element, in particular the handling portion, to the shape of a beam splitter element, such as a prism, the handling portion, and thus the polarizing optical beam splitter device etc. itself, may be made more compact and with fewer surfaces to be polished and/or antireflection-coated. The positioning of the parts in a beam splitter is more reliable. Devices, systems in which the polarizing beam splitter device has been incorporated, such as a polarizing beam splitter device with quarter wave plates and a reference mirror fixed thereto, may also be made more compact, accurate and reliable.

18 Claims, 4 Drawing Sheets

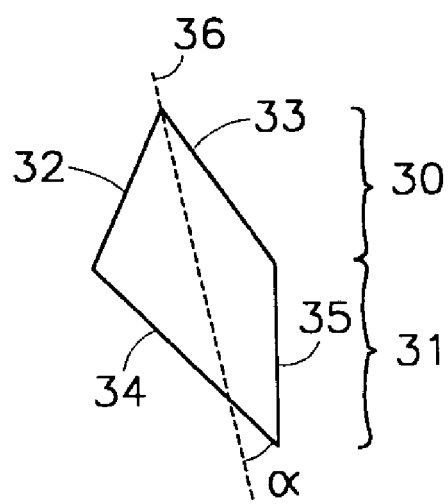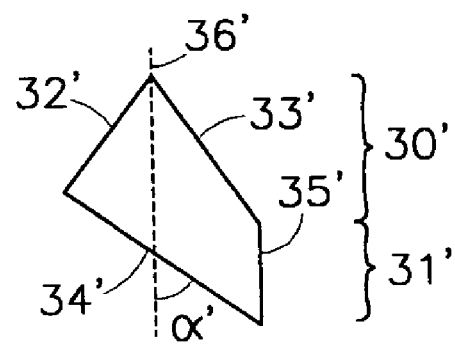
Fig 3a    Fig 3b
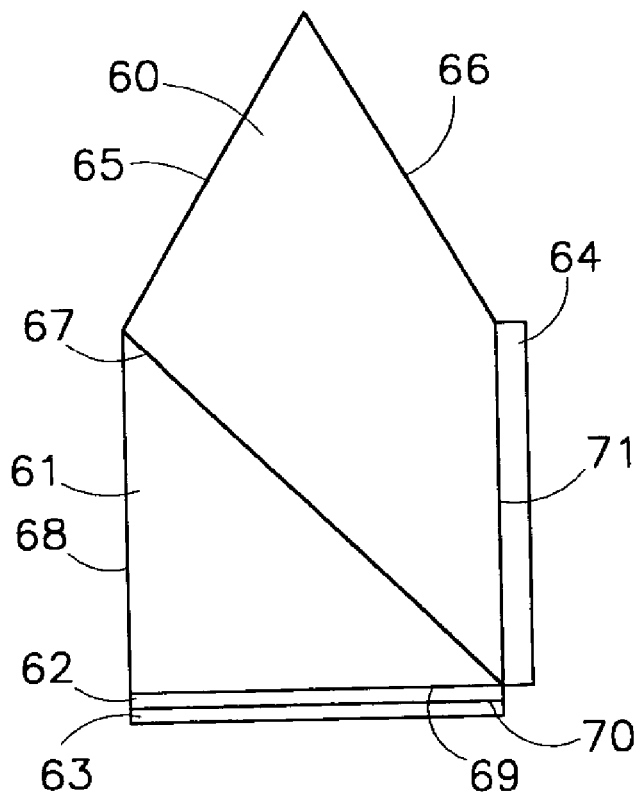
Fig 4

POLARIZING BEAM SPLITTER DEVICE, INTERFEROMETER MODULE, LITHOGRAPHIC APPARATUS, AND DEVICE MANUFACTURING METHOD

BACKGROUND

1. Field of the Invention

The present invention relates to lithographic apparatus and methods.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

In interferometry, it is possible to accurately determine displacements by measuring an interference pattern. Thereto, use may be made of beams of radiation that are made to overlap each other. A component that is used in many interferometry arrangements is a retroreflecting device, or retroreflector. This item is useful, in that it is able to reflect a beam of radiation back into the same direction of incidence, not just for one particular direction, as is any plane mirror, but for a whole range of directions. This retroreflection property may be achieved using a retroreflector surface, which generally consists of three mutually perpendicular faces, such as of a cube. A retroreflector is also called a corner cube, because the three mentioned faces may be considered a corner of a cube. Furthermore, a retroreflector has a surface through which a beam of radiation may enter the retroreflector, and may leave again after being retroreflected.

Conventionally, a retroreflector is arranged in combination with a beam splitter device, which is configured to split up a single beam of radiation into two (or more) beams of radiation. The retroreflector, as well as one or more mirrors, may be used to achieve overlap of the two (or more) beams of radiation. Thereby, an interference pattern may be obtained. Changes of the interference pattern may be used to determine a displacement.

For interferometry purposes, it is desirable that the quality of the faces and surfaces of the retroreflector be excellent. For example, it is not uncommon for the flatness of the faces to be better than 0.1 wavelength of the radiation used, e.g. better than 50 nm. Furthermore, it is desirable that the (local) surface roughness be no more than a few nanometers. In order to handle the retroreflector, without touching the functional faces with the extremely high quality surface, most if not all retroreflectors have a handler surface. This handler surface may be a surrounding portion configured to handle the retroreflector, which is sometimes called a handler portion in this context. If retroreflectors do not have such a handler portion, functional surfaces, such as the retroreflector surface, may be damaged during operation. This may occur when, for example, the retroreflector is being handled, e.g. mounted in a beam splitter or other optical device.

U.S. Pat. No. 4,504,147 discloses an alignment sensor with a corner cube that has a rounded, cylindrical handler surface adjacent the three retroreflector faces. The corner cube is coupled to a beam splitter, with an optical cement.

Similarly, a tetrahedron, which is no more than a cut off corner of a cube, generally requires such a handler portion. Such a tetrahedron has a triangular base face. Many retroreflectors have been given a rectangular base face by cutting and truncating the faces of the tetrahedron. This automatically provides a handler surface by means of the additional (truncated) side faces.

Such a handler surface or handler portion may give rise to various disadvantages. First of all, the handler portion relates to an amount of material, which is only used when handling the retroreflector. After mounting, the handler portion is useless, which is a waste of material. Furthermore, the mounting of a retroreflector in e.g. an interferometry system with a beam splitter etc. is highly critical, and requires a high accuracy and stability in time. The various known ways of mounting a retroreflector are not always satisfactory in this respect.

SUMMARY OF THE INVENTION

Embodiments of the invention include an optical element which is configured to retroreflect radiation, i.e. a retroreflector, and which is given a design in which a more efficient use is made of the material of the retroreflector, and which allows for a more precise and more stable positioning of its component parts, both mutual positioning and with respect to other parts of e.g. an interferometer system.

Embodiments of the invention also include an interferometer module, an interferometer system, an apparatus, in particular a lithographic apparatus, and a device manufacturing method, that make use of such an improved optical element and its advantages.

In an embodiment of the invention, the optical element is designed such that it may at the same time perform a retroreflector function and a polarizing beam splitter function. In an embodiment of the invention, the handler portion is redesigned, and a polarizing beam splitter layer is provided on one of the faces of the handler portion.

According to an embodiment of the present invention, there is provided a polarizing beam splitter device, including a continuous and monolithic optical element with a retroreflector surface for retroreflecting a beam of radiation that is internally incident on the retroreflector surface, a radiation beam passage surface, for passing a beam of radiation into or out of the optical element, and a handler surface for handling the polarizing beam splitter device without touching the retroreflector surface nor the radiation beam passage surface, wherein the retroreflector surface includes at least a first face, a second face and a third face that are substantially planar faces and meet at a common point, wherein the radiation beam passage surface includes a fourth face, that is substantially planar and is arranged opposite the common point, and further includes a fifth face, that is substantially planar and is arranged at an angle with respect to the fourth face, wherein the handler surface includes at least one surface that extends between the retroreflector surface and the radiation beam passage surface, wherein the polarizing beam splitter device further includes a polarizing beam splitting layer that is present on the fourth face.

Such a polarizing beam splitter device may be made very compact, with reliable and accurate positioning of the retroreflector portion and the handler (or beam splitter) portion, since both functions are now performed by a single optical element, in combination with the beam splitter layer.

In an embodiment of the present application, an angle between a plane and a line that crosses that plane is taken to be the angle between the line and its perpendicular projection onto that plane.

This polarizing beam splitter device according to an embodiment of the invention is of a very simple design, with only one optical body and a polarizing beam splitter layer.

According to another embodiment of the invention, there is provided an interferometer module, including the polarizing beam splitter device according to an embodiment of the present invention, further including a frame plate with a first side, and a second side opposite the first side, wherein the polarizing beam splitter device is mounted on the first side, and a non-polarizing beam splitter device is mounted on the second side, wherein at least one aperture is located in the frame plate between the polarizing beam splitter device and the non-polarizing beam splitter device.

According to yet another embodiment of the invention, there is provided an interferometer system, configured to measure a displacement of an object, and including a laser beam source, a polarizing beam splitter device according to an embodiment of the present invention, an optical receiver that is configured to receive an optical signal, and a processing device that is constructed and arranged to convert the optical signal to a displacement value.

According to yet another embodiment of the invention, there is provided an interferometer system, constructed and arranged to measure a displacement of an object, and including a laser beam source, an interferometer module according to an embodiment of the present invention, an optical receiver that is configured to receive an optical signal, and a processing device that is constructed and arranged to convert the optical signal to a displacement value.

According to yet another embodiment of the invention, there is provided an apparatus including a displaceable object and the interferometer system according to an embodiment of the present invention, wherein the interferometer system is constructed and arranged to determine a displacement of the object.

According to yet another embodiment of the invention, there is provided a lithographic apparatus configured to transfer a pattern from a patterning device onto a substrate, and further including an interferometer system according to an embodiment of the present invention.

According to yet another embodiment of the invention, there is provided a device manufacturing method including transferring a pattern from a patterning device onto a substrate, wherein a relative displacement of the patterning device and the substrate is determined using an interferometer system according to an embodiment of the present invention.

A polarizing beam splitter device, according to an embodiment of the invention, includes a pyramidal retroreflector portion including a first, a second and a third substantially planar faces extending from an apex of the retroreflector portion, the first, second and third planar faces being substantially perpendicular to one another; and a beam splitter portion extending from a base of the pyramidal retroreflector portion, the beam splitter portion including: a first and a second handler faces configured to handle the device, the first and second handler faces being substantially perpendicular to the base, and a beam splitting face defining an angle substantially equal to 45° with an axis of symmetry extending from the apex of the pyramidal retroreflector portion, the beam splitting face being substantially covered with a polarizing beam splitting layer.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3*a* and 3*b* schematically show cross-sectional views of two polarizing beam splitter devices according to several embodiments of the invention;

FIG. 4 schematically shows a cross-sectional view of another polarizing beam splitter device according to an embodiment of the invention;

DETAILED DESCRIPTION

Figure 1A:
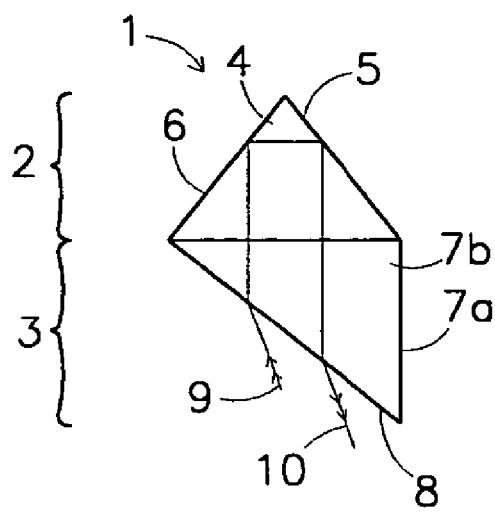
FIGS. 1*a*, 1*b* and 1*c* schematically depict a side elevational view, a top view, and a cross-sectional view along a plane I-I in FIG. 1*b*, respectively, of a polarizing beam splitter device according to an embodiment of the invention.

A polarizing optical beam splitter device is a device that is able to split a non-polarized beam of radiation into two separate beams of different polarization. One of the beams is transmitted, while the other beam is reflected. A polarizing beam splitter device generally includes at least one transparent optical body, onto which a polarizing beam splitter layer is provided.

A retroreflector surface of an optical element is a surface, that may be a complex surface, which has the property of retroreflecting a beam of radiation that is incident on that surface, at least for a certain non zero solid angle. In practice, this almost always relates to three mutually perpendicular planar faces, i.e. a corner of a mathematical cube.

A retroreflector portion, of an optical element, includes a volume of optically transparent material that is bounded by at least a retroreflector surface and an imaginary surface to form a continuous outer surface of the retroreflector portion. The imaginary surface is used to bound the volume on all sides, and may be defined as a surface that connects the edges of each of the mutually perpendicular faces that do not touch any of the other mutually perpendicular faces, the surface having the minimal surface area.

A radiation beam passage surface relates to those parts of an outer surface of the optical element through which, when the optical element or beam splitter device is in use, a beam of radiation passes into or out of the optical element. In particular, such beam of radiation is directed towards the retroreflector surface in a direction that allows retroreflection, or is directed towards the radiation beam passage surface to allow passage to the external of the optical element.

The handler surface includes all those parts of the outer surface of the optical element that are not part of the retroreflector surface or the radiation beam passage surface. The handler surface is not subject to strict requirements as to optical flatness etc. In fact, there may be few requirements on the handler surface, apart from allowing handling of the optical element. Generally, a certain degree of flatness may be provided to prevent, for example, scattered radiation, etc. It will be appreciated that the handler surface, as well as any other surface mentioned, may be a complex surface, i.e. a surface that consists of more than one elementary surface such as a planar face or part of a cylinder etc. . . .

The handler portion of the optical element also includes a volume of optically transparent material, namely the volume that is surrounded by at least the handler surface, and generally also at least a part of the radiation beam passage surface. The handler portion may also be considered as the remaining volume of the optical elements when the retroreflector portion as described above would be removed.

It should be understood that the definitions of the retroreflector portion and the handler portion are somewhat arbitrary, as they may blend into each other, without easily separating them. It will be appreciated that the optical element may be divided into those two functional parts, such that each of those parts has a conventional function, i.e. retroreflector and handler (or beam splitter) part.

A non-polarizing beam splitter device is a device somewhat similar to the polarizing optical beam splitter device, but including two optically transparent elements, in which a non-polarizing beam splitter layer is sandwiched. The non-polarizing beam splitter layer may be a partly transmitting mirror, that has substantially equal properties for both the above-mentioned polarizations. Hence a non-polarized beam is split into two beams, one reflected beam and one transmitted beam, that are each still non-polarized.

Figure 1B:
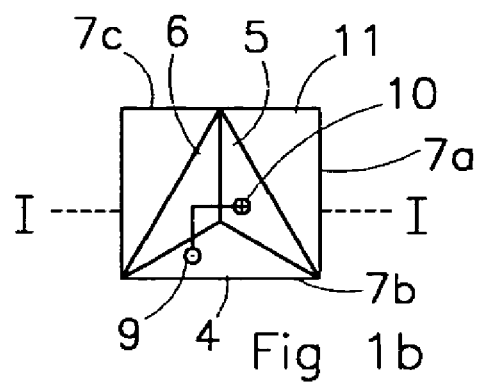
Figure 1C:
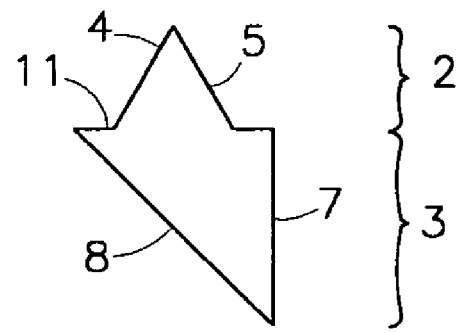

FIGS. 1a, 1b and 1c schematically depict a side elevational view, a top view, and a cross-sectional view along a plane I-I in FIG. 1b, respectively, of a polarizing beam splitter device according to an embodiment of the invention.

It will be appreciated that the embodiment shown in FIG. 1a-c is used to illustrate the invention. Embodiments shown in other figures may be produced more easily, especially from the point of view of polishing and associated costs. However, if costs do not play a role, the embodiment of FIG. 1 will serve its purpose well.

The polarizing beam splitter device in FIG. 1a includes a retroreflector portion 2 and a handler portion 3, which handler portion is embodied as a "half" of a conventional beam splitter device.

The retroreflector portion 2 includes a retroreflector surface, that consists of a first face 4, a second face 5 and a third face 6. The handler portion or beam splitter portion 3 includes a radiation beam passage surface including a face 8, which is a fourth face of the element 1, as well as a fifth face 7a. The handler portion further includes a handler surface, which may be a complex surface, and in this case includes a first handler face 7b, as well as a second handler face 7c and a third handler face 11 (both not visible here). The fourth face 8 is provided with a polarizing beam splitter layer, which is too thin to be shown separately. It will be appreciated that such layer itself may include e.g. a multi-layer of alternating optical materials etc.

An incident beam 9 and an outgoing beam 10 are also shown in FIG. 1a.

FIG. 1b shows a top view of the polarizing beam splitter device of FIG. 1a, and FIG. 1c shows a cross-sectional view thereof, taken along I-I in FIG. 1b.

The first, second and third faces 4, 5 and 6 are mutually substantially perpendicular, which means that they make mutual angles which are at least 89°, in an embodiment of the invention. In another embodiment of the invention, this angle is as close to a right angle as possible. The three faces bound the retroreflector portion 2 of the polarizing beam splitter device 1, and are reflective either due to total internal reflection and/or due to a reflective coating. The incident beam 9 and the outgoing beam 10 are shown to run parallel. This holds not only for a direction along an axis of symmetry of the retroreflector portion 2, but for a relatively large solid angle or collection of directions, e.g. in the case of uncoated surfaces 4, 5 and 6 depending on the maximum angle of total internal reflection.

It will be appreciated that in FIG. 1b, the base face of the retroreflector portion, when taken separately, is a triangle. The retroreflector portion is just a chopped off corner of a cube. In the embodiment represented in FIG. 1b, the face 4 is chosen to border on the first handler face 7b of the handler portion, but the faces 5 and 6 do not form a similar "seamless" blending transition to the additional faces of the handler part, and give rise to additional face 11. In an embodiment of the invention, the faces 5 and 6 may also be polished.

The cross-sectional view of FIG. 1c clearly shows that the retroreflector portion 2 and the handler portion 3 form one continuous and monolithic body, without any internal surfaces that would require polishing and anti-reflection coatings, yet still would give rise to residual scattered radiation, position inaccuracy etc. Furthermore, the construction of the polarizing beam splitter device 1 as shown is very compact, as the handler portion 3 serves at the same time as a portion for handling, by means of the handler surface, the whole optical element, including the retroreflector portion, and as a beam splitter portion. It will be appreciated that there are no strict requirements as to the surface quality of faces 7b, 7c and 11, because these faces are not used to condition rays that are to be retroreflected by the retroreflector portion or that pass faces 7a or 8. Hence the polarizing beam splitter device 1 may be handled via e.g. those faces 7b, 7c and 11. However, any surface that is used as an entry surface or exit surface for a beam will have to meet desired requirements.

The fourth face 8, of the handler portion 3, is a planar surface, which makes an angle with an axis of symmetry of the three faces of the retroreflector portion, which angle may be substantially 45° in an embodiment of the invention. The axis of symmetry is a line that extends through the common point of the three planar faces of the retroreflector surface and under an angle of substantially 45° with respect to each of those three planar faces. Note that the axis of symmetry is not specifically shown here. With a 45° angle, it is relatively simple to design the optical paths of the beams in, e.g., an interferometer system with right-angled paths, which simplifies the design. In fact, a 45° angle allows an orthogonal design, in which beams that enter or leave the beam splitter device are not refracted. In an embodiment of the invention, the fifth face extends substantially parallel to the line, i.e. the axis of symmetry. In another embodiment of the invention, the fifth face 7a makes an angle of substantially 45° with the fourth face 8. Note that this may depend on the angle with which a beam is incident on the polarizing beam splitter layer, which is in turn dependent on the design of the layer. It is also possible, for example, to design a polarizing beam splitter layer that effectively separates two polarizations when a beam is incident on the layer under another angle, such as 30°. In such a configuration, the reflected and transmitted beams are not orthogonal, and refraction at the faces where the beam leaves the beam splitter may need to be taken into account, as well as a modified arrangement of mirrors and/or retroreflector portion.

The handler surface includes all other parts of the external surface of the polarizing beam splitter device, or the optical element, that are not a retroreflector surface or a radiation beam passage surface. In other words, in FIG. 1, the handler surface includes faces 7b, 7c and 11. In an embodiment of the invention, the handler surface includes two separate and substantially planar mutually opposite faces that extend between the fourth face 8, the fifth face 7a and the reflector surface 4, 5 and 6. This allows easy handling, i.e. gripping, of the polarizing beam splitter device. Furthermore, the mutually opposite faces may not extend substantially parallel to the axis of symmetry of the retroreflector surface. In an embodiment of the invention, these faces extend substantially parallel to the axis of symmetry of the retroreflector surface.

The polarizing beam splitter device represented in FIGS. 1a-c may be the simplest possible device, in that it consists of one transparent optical element and a polarizing beam splitter layer. A non-polarized beam of radiation, that is incident under the correct angle, i.e. the angle for which the beam splitter layer was designed, will be split in two beams of different polarization. One of those beams is reflected, and one beam is transmitted. Due to refraction of the beam, the transmitted beam will travel under an angle with respect to the incident beam. Nevertheless, the retroreflector surface, or portion will ensure that this beam will be retroreflected and will be re-emitted at the optical beam splitter layer parallel to the incident beam. Nevertheless, in many practical designs of a beam splitter device, the influence of refraction is avoided by providing a second optical element on the opposite side of the polarizing beam splitter layer. Thus, there is provided a polarizing beam splitter device according to an embodiment of the invention, further including a second optical element having at least a first substantially planar face, wherein the polarizing beam splitter layer is sandwiched between the fourth face of the optical element and the first face of the second optical element. In an embodiment of the invention, the optical element and the second optical element are made of a first and second transparent material, respectively, wherein a refractive index of the first material is substantially equal to a refractive index of the second material. This will be elucidated below, but it is noted here that the simplest possible polarizing beam splitter device may only include one optical transparent body and a polarizing beam splitter layer.

The beam splitter portion and the retroreflector portion together form the optical element of the polarizing beam splitter device 1. In an embodiment of the invention, the beam splitter portion has a prism shape, which may be a right angled prism shape, because this greatly simplifies the design of the beam splitter device and the interferometer system. This prism shape may serve as a beam splitter portion of the beam splitter device, wherein faces 8 and 7a serve as planes through which rays of an interferometer system may enter or exit. In other words, the additional surface includes in an embodiment of the invention a substantially planar face 7a. This planar face 7a extends substantially parallel to a line, that extends through the retroreflector portion and under an angle of substantially 45° with respect to each of the three faces thereof, and under an angle with face 8, of preferably 45°. It will be appreciated that other angles can be used. In an embodiment of the invention, planes 7a and 8 are substantially planar, in order to define pathlengths more easily.

The optical element of the polarizing beam splitter device 1 may be made of an optically transparent material, such as Schott BK7 glass, quartz etc. The term optical as used herein relates to electromagnetic radiation with wavelengths with which (narrow) beams may be formed, in particular infrared, visible and ultraviolet radiation. The average flatness of the surfaces, as well as the surface roughness of the relevant surfaces, i.e. faces 4, 5, 6, 7 and 8, and the corresponding ones of other parts in the interferometer system, should be selected to match the desired accuracy. For high performance interferometer systems in lithography, a surface flatness of better than $\frac{1}{10}$th of a wavelength may be required, with a surface roughness of down to a few nm. It will be appreciated that not all applications require such high precision.

The optical element described herein, in a polarizing beam splitter device according to the invention, may be made compact, which is useful in an environment where space is crowded and expensive. It may further be made more efficiently, since the combination of retroreflector (corner cube) and the beam splitter portion into one continuous body requires fewer surfaces to be polished and antireflection-coated. This also means less scattering, reflections etc., due to eliminated material transitions.

Furthermore, the positioning of the retroreflector and the beam splitter portion with which it forms one continuous body is completely fixed and permanent. It does not suffer from changes in time due to changes in any mechanism for fixing the one relative to the other as it would in a conventional assembly of a retroreflector and beam splitter, such as e.g. swelling of an adhesive of conventional devices. There is also no specific influence of thermal distortion, e.g. due to different expansion of different materials.

The polarizing beam splitter device according to an embodiment of the invention may simply be combined with another optical element, that has a face that matches the face that is provided with the polarizing beam splitter layer. One then obtains a more conventional polarizing beam splitter device, in which refraction effects at the beam splitter layer may be largely avoided, as already pointed out above, while allowing a simpler design.

All of the above advantages hold for all other embodiments of the invention, in relation to the combination of the retroreflector and the beam splitter portion, be it as a separate item, in a more conventional beam splitter device, an interferometer device, a (lithographic) apparatus, a method, and so on. The invention is based on the realization by the inventor that combining the retroreflector and the beam splitter functions, the parts for which are often made of the same material, into one body is possible, with the above advantages. These advantages will be understood to hold for the other embodiments of the invention as described below, and will not all be repeated for every embodiment of the invention, for brevity's sake. Furthermore, vice versa, when in this description an advantage of a specific embodiment of the invention is described, it should be understood that a similar advantage will hold for a corresponding embodiment of another aspect of the invention with a similar feature. For example, a beam splitter device with one or more quarter wave plates fixed thereto provides a certain advantage that relates to reliable positioning. This same advantage will hold for a corresponding interferometer system, a (lithographic) apparatus with that plate, etc.

It will be appreciated that it is also possible to provide only a face of the second beam splitter element with a polarizing beam splitter layer. In other words, when the invention is embodied in a more conventional design, with an optical element that includes a retroreflective portion and a beam splitter portion, and a second optical element, between which a polarizing beam splitter layer is sandwiched, the beam splitter layer may first be provided on a face of the second optical element, after which the optical element is connected to the optical beam splitter layer. Nevertheless, after combination, the optical beam splitter layer is still present on the fourth face of the optical element.

Figure 2A:
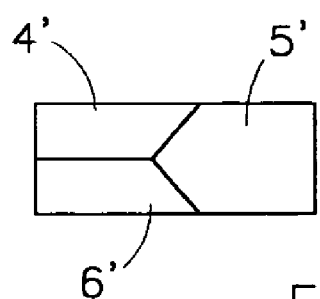
FIGS. 2*a* and 2*b* schematically shows a top view, and a side elevational view, respectively, of a polarizing beam splitter device according to another embodiment of the invention.
Figure 2B:
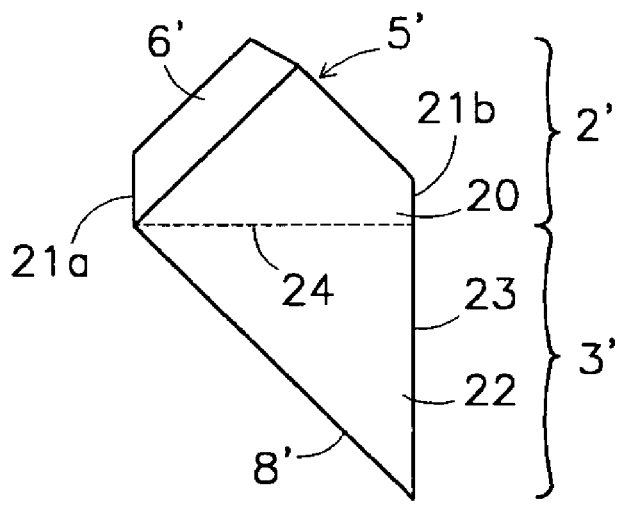

FIG. 2a schematically shows a top view of an optical element according to an embodiment of the invention, and FIG. 2b shows a side elevational view of the embodiment.

The optical element includes a retroreflector portion 2' with a retroreflector surface, and a beam splitter portion 3', which are separated, for illustrative purposes only, by an imaginary plane that is indicated with the dashed line 24.

The retroreflector portion 2' includes a retroreflector surface with three mutually substantially perpendicular faces 4', 5' and 6', as well as additional faces 20, 21a and 21b, which serve as parts of the handler surface.

The beam splitter portion 3' includes a radiation beam passage surface with a face 8', a face 23, and (a part of) the handler surface that includes additional faces 22, and an invisible counterpart face opposite 22. A polarizing beam splitter layer may be provided on face 8' (not shown in FIG. 2b).

The face 20 and its counterpart on the opposite side (not shown), as well as faces 21a and 21b originate from the retroreflector portion which is truncated to give a rectangular outline where it merges into the handler or beam splitter portion 3'.

The face 22 of the beam splitter portion 3' and the face 20 of the retroreflector portion are in fact two portions of one large face of the handler surface, as is clearly visible in the top view of FIG. 2a, and which is caused by the truncation of the retroreflector portion 2'. It is possible to obtain other shapes, e.g. the handler surface, such as e.g. a rounded, cylindrical shape as disclosed in U.S. Pat. No. 4,504,147.

FIGS. 3a and 3b schematically show cross-sectional views of two optical elements according to two alternative embodiments of the invention, taken in a plane through the common point of the faces of the retroreflector surface.

Herein, a part in FIG. 3a with a certain reference numeral corresponds to a similar part in FIG. 3b, indicated with the same but primed reference numeral.

In FIG. 3a, element 30 denotes a retroreflector portion, and element 31 a beam splitter portion. The retroreflector portion includes mutually perpendicular faces 32 and 33, and a third face (not shown in FIGS. 3a-b). This retroreflector portion 30 is not a regular tetrahedron, but more like an oblique or slanting tetrahedron. The beam splitter portion 31 includes planar faces 34 and 35. Non-visible polarizing beam splitter layer is provided on face 34. Line 36 represents an axis of symmetry of the faces of the retroreflector portion. An angle between line 36 and each of the three faces of portion 30 is substantially 45°.

The beam splitter portion 31 is itself a right-angled isosceles prism, with a radiation beam passage surface with planar faces 34 and 35, as well as a handler surface with two additional faces in front and opposite in the back (not indicated).

In FIG. 3b, the retroreflector portion 30' is a regular tetrahedron, while the beam splitter portion 31' is not an isosceles right-angled prism, since faces 34' and 35' make an angle that is larger than 45°. The polarizing beam splitter layer is provided on face 34', but is not visible in the drawing.

As can be seen in FIG. 3b, the angle $\alpha$, $\alpha'$ between the line 36, 36' and the face 34, 34' is in both cases not 45°, but smaller (FIG. 3a) or larger (FIG. 3b).

It should be understood that every depicted embodiment, which are all shown here in a cross-sectional view through an apex of the retroreflector portion, may be truncated in a way similar to the embodiment of FIG. 2a-b. The described advantages will still hold.

FIG. 4 schematically shows a cross-sectional view of another polarizing beam splitter device according to an embodiment of the invention.

The polarizing beam splitter device includes an optical element 60 similar to the one of FIG. 1, as well as a second optical or beam splitter element 61, a polarizing beam splitter layer (not visible), a first quarter wave plate 62, a plane mirror 63 and a second quarter wave plate 64.

It should be noted that in the embodiment of the invention represented in FIG. 4, the cross-section of the combination of the beam splitter portion of the optical element 60 and the second beam splitter element 61, each of which itself forms an isosceles right-angled prism, forms a square.

The optical element 60 includes mutually perpendicular faces 65 and 66, and a third face (not shown in FIG. 4), as well as a planar beam splitter surface 67, which is part of the radiation beam passage surface, and with a polarizing beam splitter layer (not visible), and an additional radiation beam passage surface 71, which is also plane. The second beam splitter element 61 includes a face at 67, as well as faces 68 and 69.

The second beam splitter element 61 is fixed, via the beam splitting layer at beam splitting surface 67, to the optical element 60. The first quarter wave plate 62 is fixed to face 69 and has an opposite side 70, to which a plane mirror 63 is fixedly connected.

This fixed connection may be brought about by glueing these two elements, e.g. with optical cement. It is also possible to provide/create the plane mirror 63 by vapor deposition etc., in which case the mirror is also fixedly connected.

The second quarter wave plate 64 is fixed to face 71. Note that each of the two quarter wave plates 62 and 64, and the plane mirror 63 need not be fixed to the second beam splitter element 61 or the optical element 60. It is however advantageous to do so, in that it makes the positioning etc. much more reliable and constant. In the case of separate quarter wave plates and/or plane mirror, which is often called a reference mirror, it is also possible to refer to the embodiment shown as an interferometer module, suitable for interferometry.

The parts 60 through 64 may be used in an interferometer system, such as use of the plane mirror 63 as a reference mirror, and use of the quarter wave plates 62 and 64 to change the polarization of a beam, in order for the beam to be transmitted or reflected by the polarizing beam splitter layer. All this may be applied in conventional ways.

Figure 5:
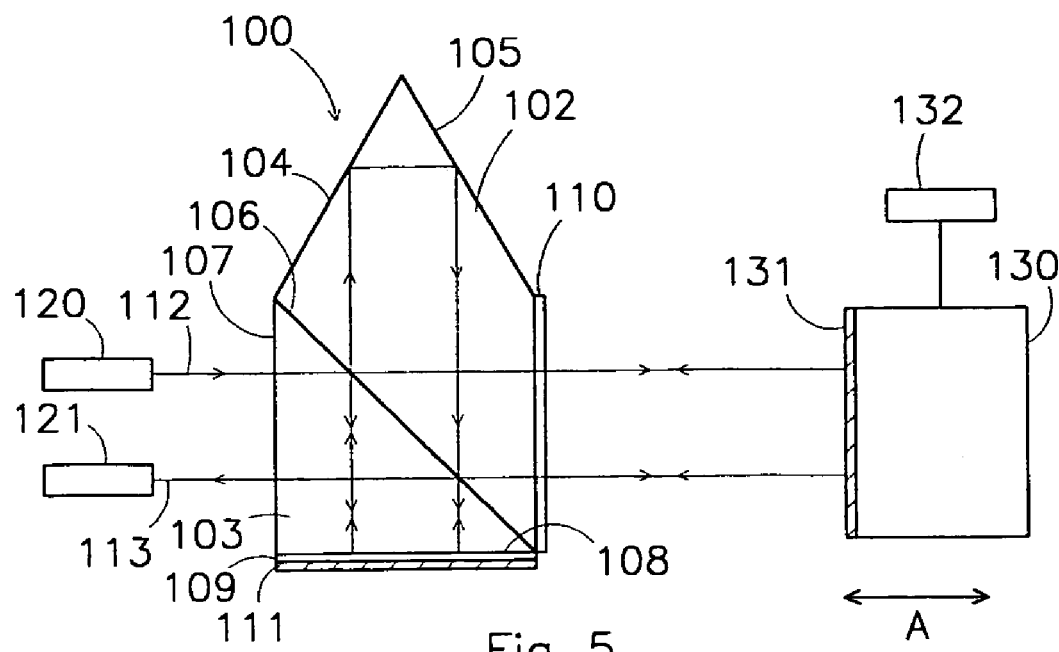
FIG. 5 schematically depicts an interferometer system according to an embodiment of the invention.

FIG. 5 schematically depicts an interferometer system according to an embodiment of the invention.

The apparatus includes a laser beam source 120, a polarizing beam splitter device 100, an optical receiver 121 and an object 130 that is displaceable in, e.g. a direction indicated by arrow A. The apparatus is constructed and arranged to measure a displacement or relative position of the object 130. A system including the laser beam source 120, the polarizing beam splitter device 100, and the optical receiver 121 may also be referred to as an interferometer system according to an embodiment of the invention, which is constructed and arranged to measure a displacement, or a relative position, of an object.

Thereto, the system and/or the apparatus may include a processing device such as a computer (not shown here) that is constructed to convert the optical signal to a displacement value, or the system and/or apparatus may e.g. be operatively coupled to such a processing device, e.g. using a cable or a suitable transmitter-receiver combination when working at a distance, etc.

The laser beam source 120 emits a laser beam 112, that enters the second beam splitter element 103 of the polarizing optical beam splitter device 100 via face 107, and travels to the polarizing beam splitter surface 106. The beam 112 is split into two partial beams at surface 116, according to known principles. After passing suitable quarter wave plates 109 and 110, and after being reflected by reference mirror 111, or by object mirror 131 that is fixedly connected to the object 130, respectively, and retroreflected by the faces 104 and 105 (and a not-shown third face) of the retroreflector portion 102, the two partial beams come to overlap a returning beam 113, which is picked up by the optical receiver 121. The optical receiver 121 receives an optical signal, resulting from the interference of the two partial beams in the returning beam 113, and converts the optical (interference) signal into an electrical signal. When the object 130 is displaced in the direction of arrow A, by object movement device 132, the interference pattern changes, and the electrical signal thus also changes. A processing device (not shown) configured to receive this signal may convert this signal to a displacement value, e.g. using suitable circuitry or software, to count and interpolate interference fringes, etc.

In an embodiment of the invention, the processing device may be coupled to the object movement device 132 to give a feedback on the movement of the object 130.

The apparatus as depicted may be of various types. In an embodiment of the invention, the apparatus is configured to determine displacements of the object with high precision, and over relatively large ranges. Examples of such an apparatus are micromachining apparatus, and lithographic apparatus, which latter example will be further described in FIG. 7 below. An advantage of the interferometer system according to an embodiment of the invention is that it may be made compact, and that it may achieve a high precision, with a reliable mutual positioning of its parts, and less manufacturing work.

Figure 6:
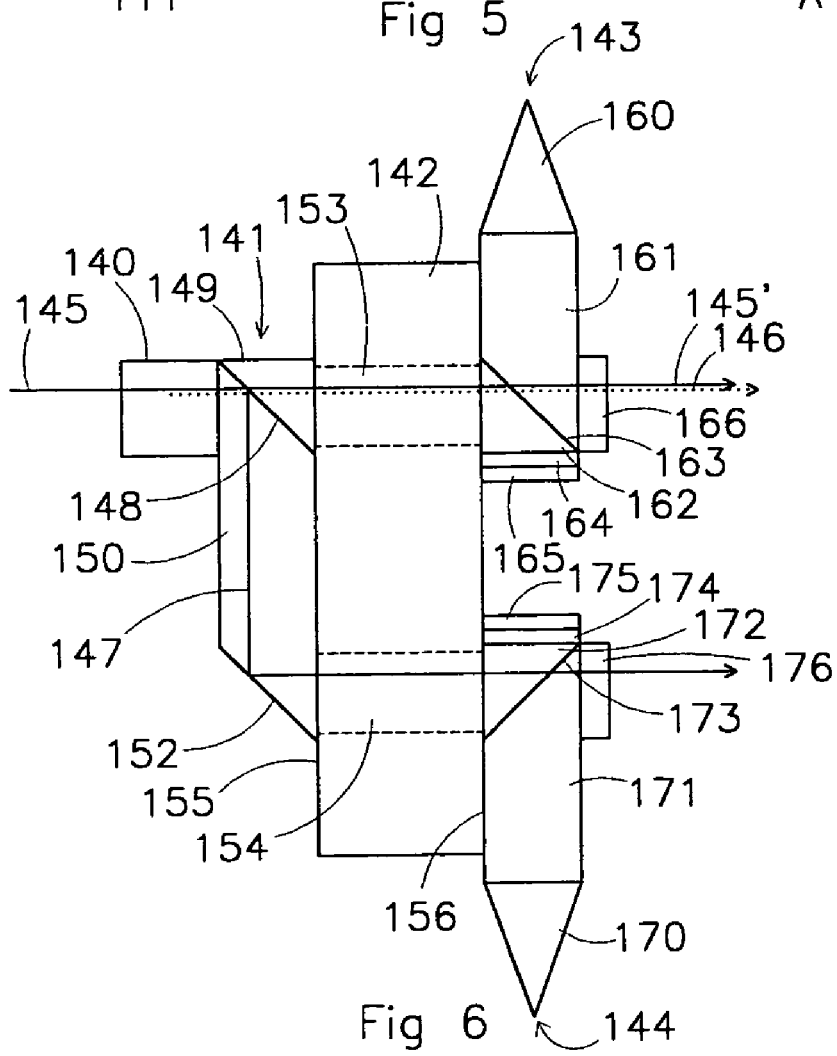
FIG. 6 schematically shows a side elevational view of an interferometer module according to an embodiment of the invention.

FIG. 6 schematically shows a side elevational view of an interferometer module according to an embodiment of the invention. The module includes a first non-polarizing beam splitter device generally denoted 140, a second non-polarizing beam splitter device 141, a frame plate 142, and three polarizing optical beam splitter devices according to an embodiment of the invention, two of which 143 and 144 are shown.

The second non-polarizing beam splitter device 141 is configured to split an incident beam 145 into two parallel outgoing beams 145' and 147 of half intensity, and includes a non-polarizing beam splitter layer 148 between a first element 149 and a second element having a face 152. The non-polarizing beam splitting layer is configured to split an incident beam into two beams of an intensity that is equal to half of the intensity of the incident beam. The face 152 may be simply a 45° face, with total internal reflection, or it may be a mirror-coated face. In an embodiment of the invention, the face 152 and the layer 148 are parallel.

The first non-polarizing beam splitter device 140 is similar to device 141, except that it is rotated over 90° around the direction of beam 145, and it is configured to split off a parallel beam 146 from beam 145, with an intensity ratio of 2:1. The combination of the first and second non-polarizing beam splitter devices is thus configured to provide three parallel beam 145, 146 and 147 with equal intensities of one-third of that of the original beam 145. It is possible to provide a different number of beams, in which case the ratios of the non-polarizing beam splitters should be modified. In an embodiment of the invention, device 140 is entirely optional, and more than two non-polarizing beam splitter devices could be provided.

The second non-polarizing beam splitter device 141 is mounted to a frame plate 142, on a second side 155 thereof. On a first side 156 of the frame plate, opposite the second side 155, there are mounted three non-polarizing beam splitter devices 143 and 144, according to an embodiment of the invention, only two of which, denoted 143 and 144, are shown. Each of the non-polarizing beam splitter devices preferably includes a retroreflector portion 160, 170, a first beam splitter element 161, 171, and a second beam splitter element 162, 172, a polarizing beam splitter surface 163, 173 therebetween, first and second quarter wave plates 164 and 166, 174 and 176, and a reference mirror 165, 175. It should be noted that both polarizing beam splitter devices 143 and 144 are shown as mirror images, which need not be the case. Furthermore, the quarter wave plates and the reference mirror need not be fixed to the polarizing optical beam splitter device. Not shown is a third polarizing optical beam splitter device configured to generate an interference pattern with the beam 146. It should be noted that the retroreflector portions of FIG. 6 have been truncated to obtain a rectangular base plane. The retroreflector portions each still form a continuous and monolithic piece of material with their respective polarizing optical beam splitter element.

The frame plate 142 is made, for example, of steel, or some other suitable rigid material, such as Invar, ceramics, etc., and is configured to hold the optical parts and devices. In order to become "transparent", the frame plate 142 is provided, in an embodiment of the invention, with through-holes or apertures 153 and 154, that run from side 155 to 156. The dimensions of the holes 153 and 154, and any other additional hole, may be adapted to the possible positions of the beams used, e.g. in this case 145('), 146 and 147, and their respective return beams (not shown).

It will be appreciated that the polarizing beam splitter devices 143 and 144 of FIG. 6 may be made as small as is necessary. Instead of providing a single beam splitter device for more than one beam, as is sometimes done in conventional beam splitters, it is now possible to provide two or more much smaller beam splitter devices, mounted on a stable plate. This reduces the amount of optical glass, the amount of polishing and coating, et cetera. Furthermore, the freedom of material for the plate 142 allows for the choice of a material with a lower coefficient of expansion than optical glass, which further improves dimensional stability and hence measuring accuracy with respect to the multiple-beam prior art beam splitters. Note that it is not necessary that all non-polarizing beam splitter devices 140, 141, and polarizing beam splitter devices are mounted to one and the same plate. There may be provided, in an embodiment of the invention, two plates (or other mounting devices) with matching apertures, for example to provide the possibility of exchanging parts without affecting other parts of the system. The interferometer module as depicted in FIG. 6 may also be incorporated in an interferometer system e.g. as described in FIG. 5, to achieve the same advantages as mentioned above.

Figure 7:
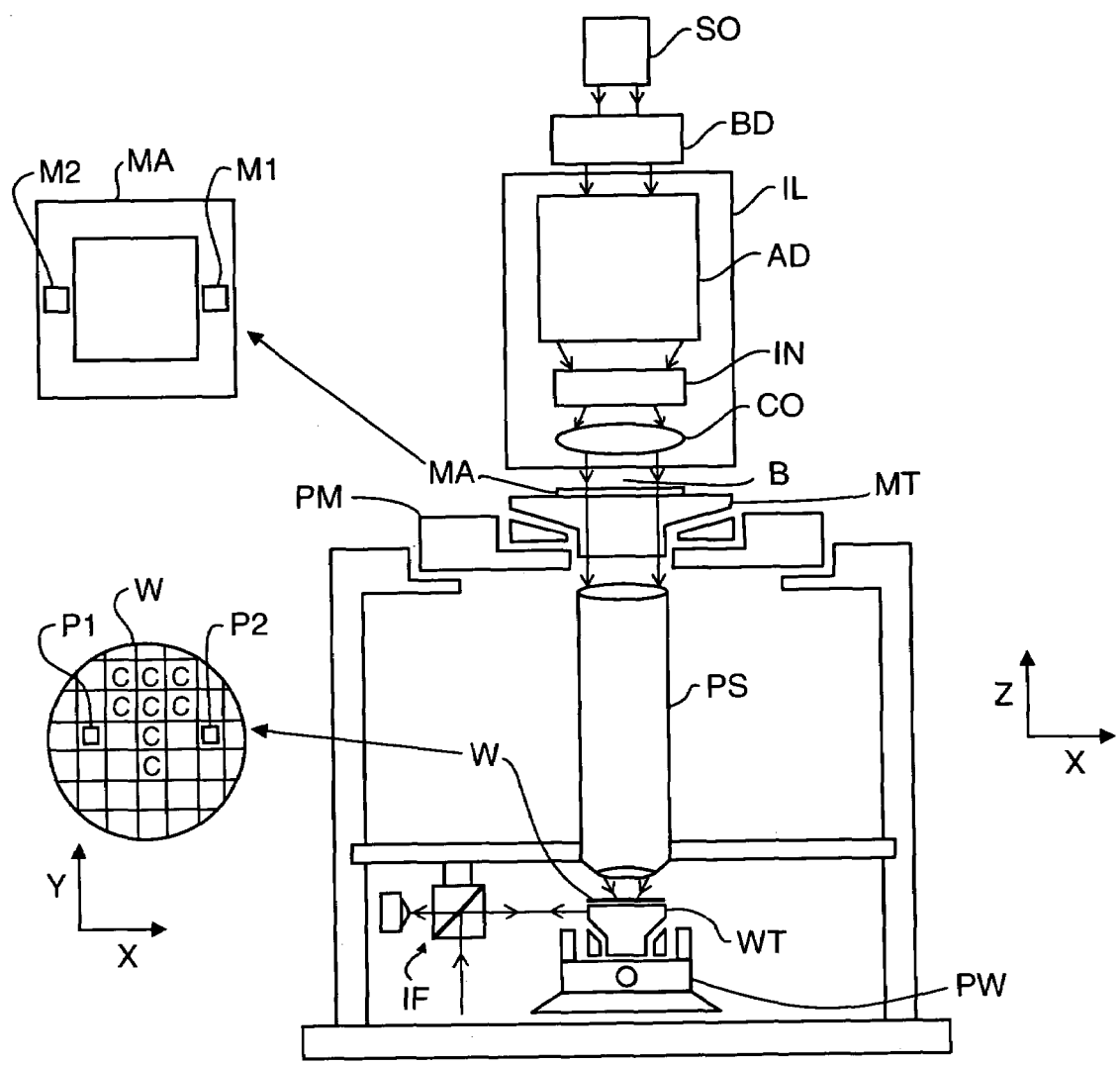
FIG. 7 depicts a lithographic apparatus according to an embodiment of the invention.

FIG. 7 schematically depicts a lithographic apparatus according to one embodiment of the invention, with an interferometer system according to the invention. The apparatus includes an illumination system (illuminator) IL configured to condition a radiation beam B (e.g. UV radiation)

a support structure (e.g. a mask table) MT configured to support a patterning device (e.g. a mask) MA, that is configured to impart the radiation beam with a pattern in its cross-section to form a patterned radiation beam. The support structure is connected to a first positioner PM configured to accurately position the patterning device in accordance with certain parameters. The apparatus also includes a substrate table (e.g. a wafer table) WT configured to hold a substrate (e.g. a resist-coated wafer) W and connected to a second positioner PW configured to accurately position the substrate in accordance with certain parameters, at least some of which may be controlled by an interferometer system IF according to the invention. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure. The displacement of one or more of such substrate table may be determined with an interferometer system according to an embodiment of the invention. In the lithographic apparatus, one or more of such interferometer systems may be provided to that end.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 7, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF, in this case an interferometer system according to an embodiment of the invention, the substrate table WT can be moved accurately, e.g. so as to position different target portions C in the path of the radiation beam B. Similarly, the first positioner PM and another position sensor, which may also be an interferometer system according to an embodiment of the invention (not explicitly depicted in FIG. 9) can be used to accurately position the mask MA with respect to the path of the radiation beam B, e.g. after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. The movement(s) may be measured with the interferometer system IF, and the measured movement may be fed back to positioner(s). In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure. To measure and/or control the displacement, it is possible to use the interferometer system IF, after each shift.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. The displacement of the substrate table WT and/or the mask table MT may, again, be determined with one or more interferometer systems according to an embodiment of the invention. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. As above, the displacement of the substrate table WT may be determined with an interferometer system IF according to an embodiment of the invention. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

In general, the lithographic apparatus may be used to in a device manufacturing method including transferring a pattern from a patterning device onto a substrate. The relative displacement of the patterning device and the substrate may be determined using an interferometer system according to an embodiment of the invention. In an embodiment of the invention, transferring the pattern includes projecting a patterned beam of radiation onto the substrate. It will be appreciated that the present methods provide high positioning accuracy with a compact interferometer system, at low cost.

It should be realized that the lithographic apparatus as depicted in FIG. 9 is only one embodiment of an apparatus according to the invention, with an interferometer system according to an embodiment of the invention, and that various parts may be modified.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be appreciated that modifications may be made to the invention as described without departing from the scope of the claims set out below.

What is claimed is:

1. A polarizing beam splitter device, comprising:
   (a) a continuous and monolithic optical element, including;
      (i) a retroreflector surface configured to retroreflect a beam of radiation that is internally incident on the retroreflector surface, said retroreflector surface comprising at least a first face, a second face and a third face that are substantially planar faces that meet at a common point,
      (ii) a radiation beam passage surface configured to transmit a beam of radiation into or out of the optical element, said radiation beam passage surface comprising a fourth face that is substantially planar and arranged opposite said common point and a fifth face that is substantially planar and arranged at an angle with respect to said fourth face, and
      (iii) a handler surface configured to handle the polarizing beam splitter device without touching the retroreflector surface or the radiation beam passage surface, said handler surface comprising at least one surface that extends between said retroreflector surface and said radiation beam passage surface;
   (b) a polarizing beam splitting layer disposed on said fourth face; and
   (c) a second optical element having at least one substantially planar face,
   wherein the polarizing beam splitter layer is sandwiched between said fourth face of the optical element and said at least one substantially planar face of said second optical element, and the optical element and the second optical element are made of a first and second transparent material, respectively, and, wherein a refractive index of said first material is substantially equal to a refractive index of said second material.

2. The polarizing beam splitter device of claim 1, wherein a line that extends through said common point and under a first angle of substantially 45° with respect to each of said first, second and third faces, makes a second angle with said fourth face that is less than 90°.

3. The polarizing beam splitter device of claim 2, wherein said second angle is substantially 45°.

4. The polarizing beam splitter device of claim 2, wherein said fifth face extends substantially parallel to said line.

5. The polarizing beam splitter device of claim 1, wherein said fifth face makes an angle of substantially 45° with said fourth face.

6. The polarizing beam splitter device of claim 1, wherein said handler surface comprises two separate and substantially planar and mutually opposite faces that extend between said fourth face, said fifth face, and said retroreflector surface.

7. The polarizing beam splitter device of claim 6, wherein said mutually opposite faces extend substantially parallel to a line that extends through said common point at a first angle of substantially 45° with respect to each of said first second, and third faces.

8. The polarizing beam splitter device of claim 1, wherein said fourth face makes an angle of substantially 45° with a line that extends through said common point and at a first angle of substantially 45° with respect to each of said first, second and third faces,
   wherein said fifth face of said optical element extends substantially parallel to said line, and
   wherein said second optical element further comprises a second substantially planar face, that extends substantially parallel to said fifth face of said optical element.

9. The polarizing beam splitter device of claim 1, further comprising at least one quarter wave plate that is fixedly connected to one of the faces of said polarizing optical beam splitter device.

10. The polarizing beam splitter device of claim 9, wherein one of said at least one quarter wave plates has a side that faces away from said polarizing optical beam splitter device, to which side a plane mirror has been fixedly connected or connected via a coating process.

11. The polarizing beam splitter device of claim 1, further comprising a non-polarizing beam splitter device.

12. An interferometer module, comprising:
   a polarizing beam splitter device, comprising:
      (a) a continuous and monolithic optical element, including;
         (i) a retroreflector surface configured to retroreflect a beam of radiation that is internally incident on the retroreflector surface, said retroreflector surface comprising at least a first face, a second face, and a third face that are substantially planar faces and meet at a common point,
         (ii) a radiation beam passage surface configured to transmit a beam of radiation into or out of the optical element, said radiation beam passage surface comprising a fourth face that is substantially planar and is arranged opposite said common point and a fifth face that is substantially planar and is arranged at an angle with respect to said fourth face, and
         (iii) a handler surface configured to handle the polarizing beam splitter device without touching the retroreflector surface or the radiation beam passage surface, said handler surface comprising at least one surface that extends between said retroreflector surface and said radiation beam passage surface;
      (b) a polarizing beam splitting layer disposed on said fourth face;
      (c) a second optical element having at least a first substantially planar face, wherein the polarizing beam splitter layer is sandwiched between said fourth face of the optical element and said at least first face of said second optical element; and
      (d) a non-polarizing beam splitter device; and
   a frame plate with a first side and a second side opposite the first side,
      wherein said polarizing beam splitter device is mounted on the first side of said frame plate, and the non-polarizing beam splitter device is mounted on the second side of said frame plate, and wherein said frame plate includes at least one aperture located between said polarizing beam splitter device and said non-polarizing beam splitter device.

13. The interferometer module of claim 12, further comprising at least one additional polarizing beam splitter device mounted on said frame plate on the first side thereof, wherein said frame plate includes at least one aperture between said additional polarizing beam splitter device and said non-polarizing beam splitter device and wherein said additional polarizing beam splitter device includes:

(a) a continuous and monolithic optical element, including:
   (i) a retroreflector surface configured to retroreflect a beam of radiation that is internally incident on the retroreflector surface, said retroreflector surface comprising at least a first face, a second face, and a third face that are substantially planar faces and meet at a common point,
   (ii) a radiation beam passage surface configured to transmit a beam of radiation into or out of the optical element, said radiation beam passage surface comprising a fourth face that is substantially planar and is arranged opposite said common point and a fifth face that is substantially planar and is arranged at an angle with respect to said fourth face, and
   (iii) a handler surface configured to handle the polarizing beam splitter device without touching the retroreflector surface or the radiation beam passage surface, said handler surface comprising at least one surface that extends between said retroreflector surface and said radiation beam passage surface; and (b) a polarizing beam splitting layer disposed on said fourth face, wherein said handler surface comprises two separate and substantially planar mutually opposite faces that extend between said fourth face, said fifth face and said retroreflector surface.

14. An interferometer system configured to measure a displacement of an object, comprising:

a laser beam source;

a polarizing beam splitter device, comprising:

(a) a continuous and monolithic optical element, including:
   (i) a retroreflector surface configured to retroreflect a beam of radiation that is internally incident on the retroreflector surface, said retroreflector surface comprising at least a first face, a second face, and a third face that are substantially planar faces and meet at a common point,
   (ii) a radiation beam passage surface configured to transmit a beam of radiation into or out of the optical element, said radiation beam passage surface comprising a fourth face that is substantially planar and is arranged opposite said common point and a fifth face that is substantially planar and is arranged at an angle with respect to said fourth face, and
   (iii) a handler surface configured to handle the polarizing beam splitter device without touching the retroreflector surface or the radiation beam passage surface, said handler surface comprising at least one surface that extends between said retroreflector surface and said radiation beam passage surface; and (b) a polarizing beam splitting layer disposed on said fourth face; and (c) a second optical element having at least one substantially planar face, wherein the polarizing beam splitter layer is sandwiched between said fourth face of the optical element and said at least one substantially planar face of said second optical element, and the optical element and the second optical element are made of a first and second transparent material, respectively, and, wherein a refractive index of said first material is substantially equal to a refractive index of said second material, and wherein said handler surface comprises two separate and substantially planar mutually opposite faces that extend between said fourth face, said fifth face and said retroreflector surface;

an optical receiver that is able to receive an optical signal; and a processing device that is constructed to convert said optical signal to a displacement value.

15. An apparatus comprising a displaceable object and the interferometer system of claim 14, wherein the interferometer system is constructed and arranged to determine a displacement of said object.

16. A lithographic apparatus comprising:

a radiation system configured to condition a beam of radiation;

a substrate holder configured to hold a substrate;

a projection system configured to project the beam of radiation onto a target portion on said substrate; and an interferometer system configured to measure a displacement of said substrate, said interferometer comprising:

(a) a laser beam source;

(b) a polarizing beam splitter device, comprising:
   (i) a continuous and monolithic optical element, including;
      (1) a retroreflector surface configured to retroreflect a beam of radiation that is internally incident on the retroreflector surface, said retroreflector surface comprising at least a first face, a second face, and a third face that are substantially planar faces and meet at a common point,
      (2) a radiation beam passage surface configured to transmit a beam of radiation into or out of the optical element, said radiation beam passage surface comprising a fourth face that is substantially planar and is arranged opposite said common point and a fifth face that is substantially planar and is arranged at an angle with respect to said fourth face, and
      (3) a handler surface configured to handle the polarizing beam splitter device without touching the retroreflector surface or the radiation beam passage surface, said handler surface comprising at least one surface that extends between said retroreflector surface and said radiation beam passage surface;
   (ii) a polarizing beam splitting layer disposed on said fourth face; and
   (iii) a second optical element having at least one substantially planar face,
   wherein the polarizing beam splitter layer is sandwiched between said fourth face of the optical element and said at least one substantially planar face of said second optical element, and the optical element and the second optical element are made of a first and second transparent material, respectively, and, wherein a refractive index of said first material is substantially equal to a refractive index of said second material, and wherein said handler surface comprises two separate and substantially planar mutually opposite faces that extend between said fourth face, said fifth face and said retroreflector surface;

an optical receiver that is able to receive an optical signal; and a processing device that is constructed to convert said optical signal to a displacement value.

17. A device manufacturing method comprising:

patterning a beam of radiation;

projecting the beam of radiation onto a substrate;

measuring a displacement of said substrate with an interferometer system comprising;
- (a) a laser beam source;
- (b) a polarizing beam splitter device, comprising:
  - (i) a continuous and monolithic optical element, including;
    - (1) a retroreflector surface configured to retroreflect a beam of radiation that is internally incident on the retroreflector surface, said retroreflector surface comprising at least a first face, a second face, and a third face that are substantially planar faces and meet at a common point,
    - (2) a radiation beam passage surface configured to transmit a beam of radiation into or out of the optical element, said radiation beam passage surface comprising a fourth face that is substantially planar and is arranged opposite said common point and a fifth face that is substantially planar and is arranged at an angle with respect to said fourth face, and
    - (3) a handler surface configured to handle the polarizing beam splitter device without touching the retroreflector surface or the radiation beam passage surface, said handler surface comprising at least one surface that extends between said retroreflector surface and said radiation beam passage surface;
  - (ii) a polarizing beam splitting layer disposed on said fourth face; and
  - (iii) a second optical element having at least one substantially planar face,
    wherein the polarizing beam splitter layer is sandwiched between said fourth face of the optical element and said at least one substantially planar face of said second optical element, and the optical element and the second optical element are made of a first and second transparent material, respectively, and, wherein a refractive index of said first material is substantially equal to a refractive index of said second material, and wherein said handler surface comprises two separate and substantially planar mutually opposite faces that extend between said fourth face, said fifth face and said retroreflector surface;
- (c) an optical receiver that is able to receive an optical signal; and
- (d) a processing device that is constructed to convert said optical signal to a displacement value; and positioning the substrate based on the displacement measured by the interferometer system.

18. A polarizing beam splitter device comprising:

a pyramidal retroreflector portion including a first, a second and a third substantially planar faces extending from an apex of said retroreflector portion, said first, second and third planar faces being substantially perpendicular to one another; and a beam splitter portion extending from a base of said pyramidal retroreflector portion such that the pyramidal retroreflector portion and the beam splitter portion form a continuous and monolithic optical element, said beam splitter portion including:
- (a) a first and a second handler faces configured to handle said device, said first and second handler faces being substantially perpendicular to said base,
- (b) a beam splitting face defining an angle substantially equal to 45° with an axis of symmetry extending from the apex of said pyramidal retroreflector portion, said beam splitting face being substantially covered with a polarizing beam splitting layer; and a second optical element having at least one substantially planar face, wherein the polarizing beam splitter layer is sandwiched between said fourth face of the optical element and said at least one substantially planar face of said second optical element, and the optical element and the second optical element are made of a first and second transparent material, respectively, and, wherein a refractive index of said first material is substantially equal to a refractive index of said second material.

* * * * *